(12) United States Patent
Toyota et al.

(10) Patent No.: US 8,044,541 B2
(45) Date of Patent: Oct. 25, 2011

(54) MULTI-DEGREE-OF-FREEDOM ACTUATOR AND STAGE DEVICE

(75) Inventors: Akihito Toyota, Fukuoka (JP); Toru Shikayama, Fukuoka (JP); Masanobu Kakihara, Fukuoka (JP); Toshiyuki Kono, Fukuoka (JP); Mitsunori Nagao, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 12/879,019

(22) Filed: Sep. 10, 2010

(65) Prior Publication Data

US 2010/0327669 A1    Dec. 30, 2010

Related U.S. Application Data

(63) Continuation of application No. PCT/JP2009/055406, filed on Mar. 19, 2009.

(30) Foreign Application Priority Data

Apr. 18, 2008  (JP) ................................ 2008-108768

(51) Int. Cl.
*H02K 41/02* (2006.01)
(52) U.S. Cl. .................. 310/12.05; 310/12.01
(58) Field of Classification Search ............ 310/12.01, 310/12.05, 12.03, 12.06, 12.24–12.26; *H02K 41/02*
See application file for complete search history.

(56) References Cited

U.S. PATENT DOCUMENTS

| 6,184,596 B1 * | 2/2001 | Ohzeki ................ 310/12.06 |
|---|---|---|
| 6,445,093 B1 * | 9/2002 | Binnard ............... 310/12.06 |
| 6,841,956 B2 * | 1/2005 | Hazelton et al. ........ 318/135 |
| 7,075,197 B2 * | 7/2006 | Korenaga ............. 310/12.05 |
| 7,161,657 B2 * | 1/2007 | De Weerdt ............... 355/53 |
| 7,800,258 B2 * | 9/2010 | Ito ..................... 310/12.29 |
| 2005/0030503 A1 | 2/2005 | De Weerdt |
| 2005/0231043 A1 | 10/2005 | Vermeulen et al. |
| 2006/0232142 A1 * | 10/2006 | Binnard ................. 310/12 |
| 2010/0167556 A1 * | 7/2010 | Totsu et al. ............ 438/795 |

FOREIGN PATENT DOCUMENTS

| JP | 2003-264974 | 9/2003 |
|---|---|---|
| JP | 2004-254489 | 9/2004 |
| JP | 2005-057289 | 3/2005 |
| JP | 2005-311388 | 11/2005 |

OTHER PUBLICATIONS

International Search Report for International Application No. PCT/JP2009/055406, Jun. 16, 2009.
Written Opinion of the International Searching Authority for International Application No. PCT/JP2009/055406, Jun. 16, 2009.

* cited by examiner

*Primary Examiner* — Quyen Leung
*Assistant Examiner* — Thomas Truong
(74) *Attorney, Agent, or Firm* — Ditthavong Mori & Steiner, P.C.

(57) ABSTRACT

A multi-degree-of-freedom actuator includes a movable element having a plurality of permanent magnets, and a stator including a stator core and a plurality of coils. The permanent magnets are arranged in the X direction such that the number P of poles is an even number of two or more. The coils are of two types: X-direction driving coil and Z-direction driving coil. The Z-direction driving coils the number of which is P are disposed at positions opposite to magnetic poles of the permanent magnets. The X-direction driving coil or coils the number of which is P/2 are each disposed at a position opposite to an intermediate point between two adjacent ones of the magnetic poles of the permanent magnets.

9 Claims, 11 Drawing Sheets

MULTI-DEGREE-OF-FREEDOM ACTUATOR AND STAGE DEVICE

CROSS-REFERENCE TO RELATED APPLICATION

The present application is a continuation application of PCT/JP2009/055406, filed Mar. 19, 2009, which claims priority to Japanese Patent Application No. 2008-108768, filed Apr. 18, 2008. The contents of these applications are incorporated herein by reference in their entirety.

BACKGROUND OF THE INVENTION

1. Field of the Invention

The present invention relates to a multi-degree-of-freedom actuator and a stage device.

2. Description of the Related Art

In some conventional multi-degree-of-freedom actuators, as shown in Japanese Unexamined Patent Application Publication No. 2004-254489, a movable element includes permanent magnets arrayed in the XY plane, and a stator includes coils. Control currents having phase differences are supplied to each pair of adjacent ones of the coils. The movable element is thrust in the X direction and is levitated in the Z direction by electromagnetic force.

SUMMARY OF THE INVENTION

According to one aspect of the present invention, a multi-degree-of-freedom actuator includes a movable element having a plurality of permanent magnets, and a stator including a stator core and a plurality of coils. The permanent magnets are arranged in the X direction such that the number P of poles is an even number of two or more. The coils are of two types: X-direction driving coil and Z-direction driving coil. The Z-direction driving coils the number of which is P are disposed at positions opposite to magnetic poles of the permanent magnets. The X-direction driving coil or coils the number of which is P/2 are each disposed at a position opposite to an intermediate point between two adjacent ones of the magnetic poles of the permanent magnets.

According to another aspect of the present invention, a stage device includes at least three multi-degree-of-freedom actuators each including a movable element having a plurality of permanent magnets, and a stator including a stator core and a plurality of coils, and a levitating element moved with multiple degrees of freedom by the multi-degree-of-freedom actuators.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
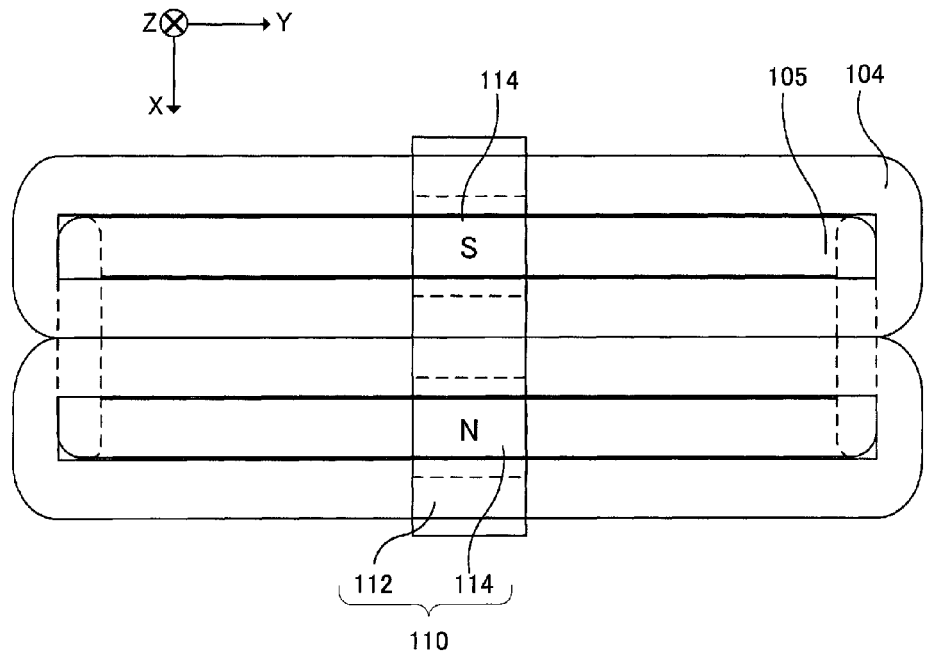
FIG. 1 is a bottom view of a multi-degree-of-freedom actuator showing a first embodiment.

Embodiments will now be described with reference to the accompanying drawings, wherein like reference numerals designate corresponding or identical elements throughout the various drawings.

First Embodiment

A multi-degree-of-freedom actuator according to a first embodiment of the present invention will be described with reference to the bottom view of FIG. 1, the side view of FIG. 2, and the sectional view of FIG. 3.

A movable element 110 includes permanent magnets 114 and a movable element yoke 112. A stator 100 includes a stator core 118, an X-direction driving coil 105, and Z-direction driving coils 104.

The permanent magnets 114, the number P of poles of which is two, are arranged with alternating polarity in the X direction. The Z-direction driving coils 104, the number of which is P=2, are disposed at positions opposite to the magnetic poles of the permanent magnets 114. The X-direction driving coil 105, the number of which is P/2=1, is disposed at a position such that the coil sides of the X-direction driving coil 105 are located in the centers of the Z-direction driving coils 104.

Figure 2:
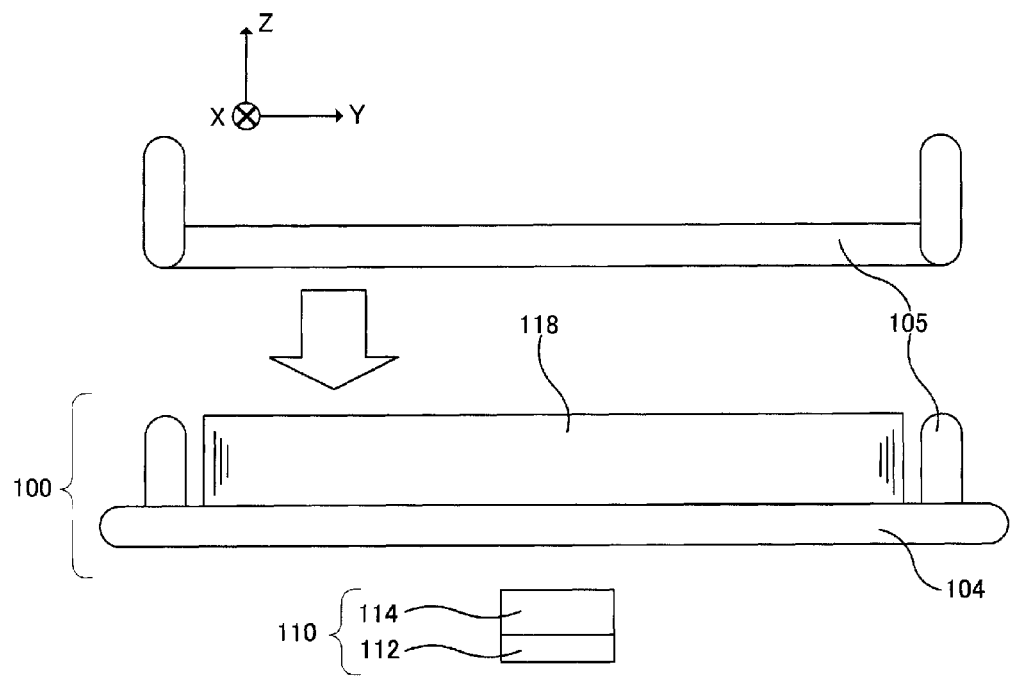
FIG. 2 is a side view of the multi-degree-of-freedom actuator showing the first embodiment.
Figure 3:
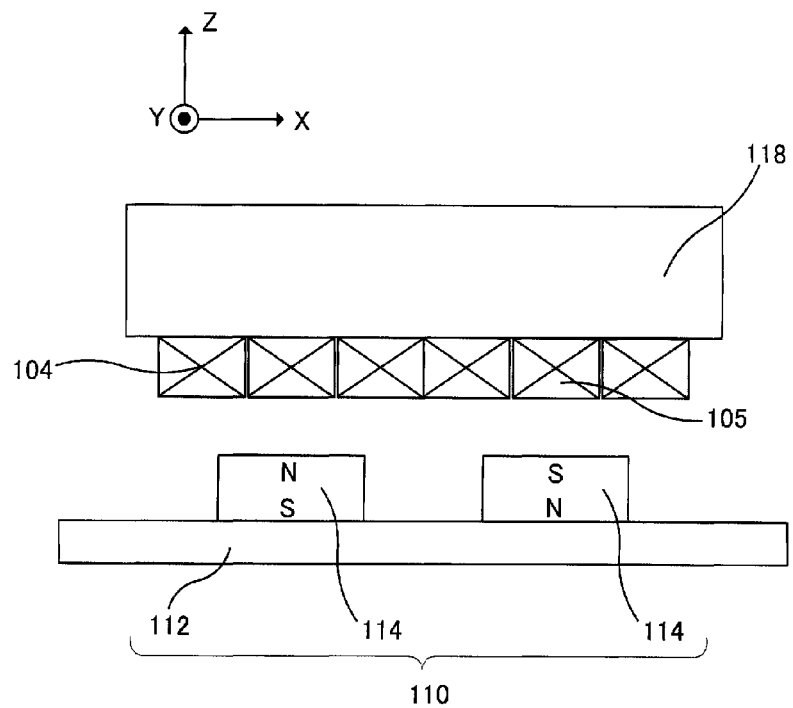
FIG. 3 is a front sectional view of the multi-degree-of-freedom actuator showing the first embodiment.

As shown in FIG. 2, the coil ends of the X-direction driving coil 105 are bent, and the coil sides of the X-direction driving coil 105 are embedded into the air cores of the Z-direction driving coils 104.

The stator core 118 is a magnetic material, for example, a laminated magnetic steel sheet for the purpose of reducing iron loss, or a powder magnetic core.

Figure 4:
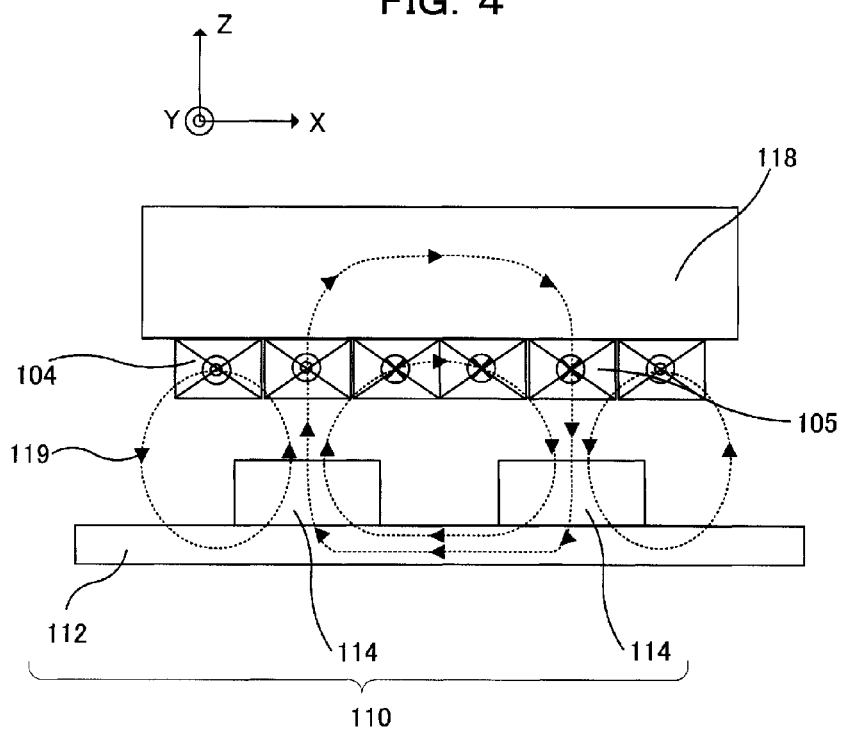
FIG. 4 shows the principle of generation of variable levitation force and thrust force in the first embodiment.

FIG. 4 shows the principle of generation of levitation force, variable levitation force, and thrust force. Dotted lines show magnetic flux lines 119 due to the permanent magnets 114.

First, magnetic attractive force is generated between the permanent magnets 114 and the stator core 118. This serves as levitation force.

Next, as shown by the magnetic flux lines 119 due to the permanent magnets 114, the magnetic flux in the ±Z direction of magnetic flux density passes through the X-direction driving coil 105, and the magnetic flux in the ±X direction of magnetic flux density passes through the Z-direction driving coils 104.

When electrical current is applied in the direction shown in FIG. 4, Lorentz force in the −Z direction is generated in the Z-direction driving coils 104, and as a result, variable levitation force is generated in the movable element 110 in the Z direction.

In addition, Lorentz force in the −X direction is generated in the X-direction driving coil 105, and as a result, thrust force is generated in the movable element 110 in the +X direction.

Figure 5:
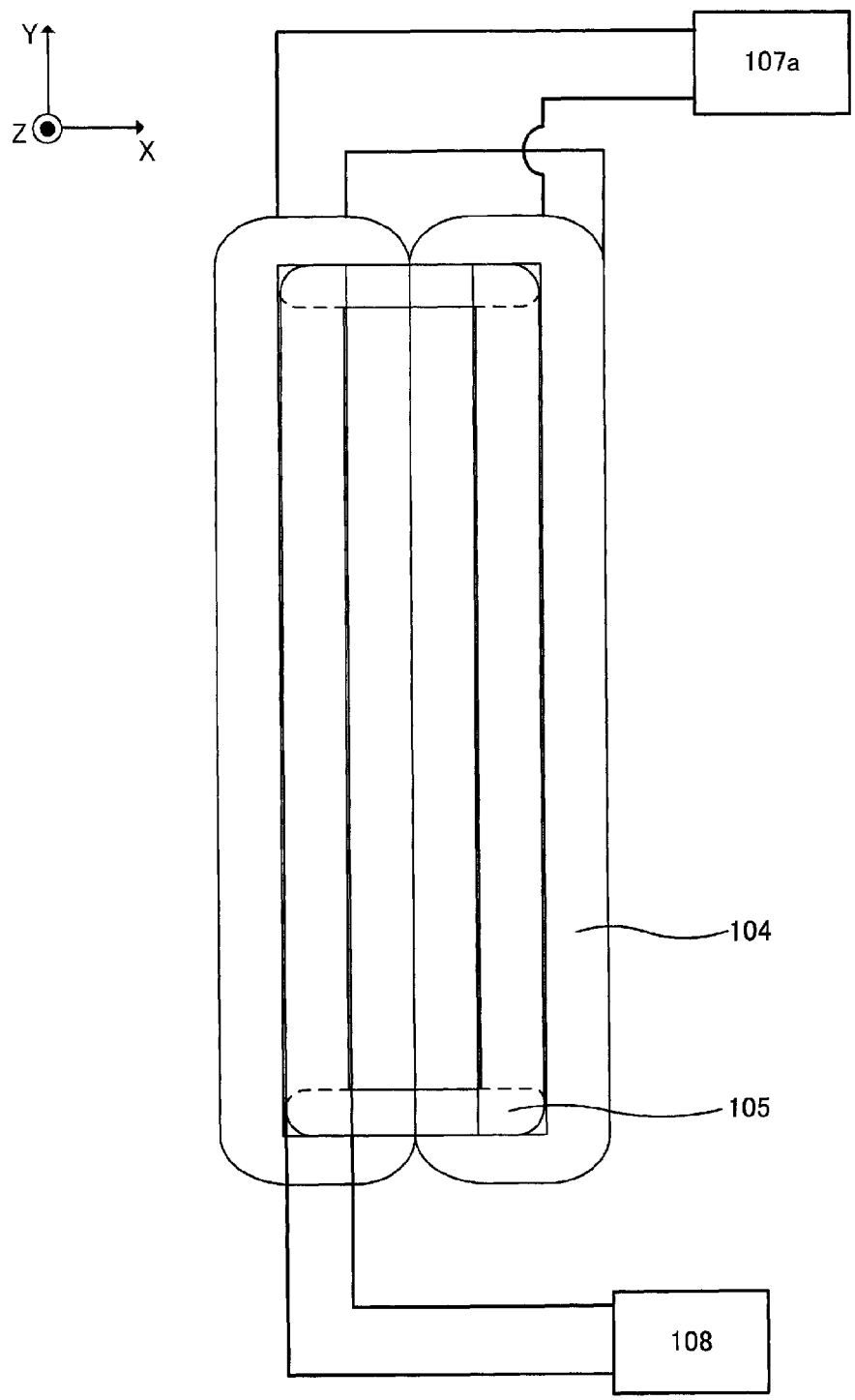
FIG. 5 is a connection configuration diagram of the multi-degree-of-freedom actuator and amplifiers showing the first embodiment.

The connection configuration between the multi-degree-of-freedom actuator and amplifiers is shown in FIG. 5. The X-direction driving coil 105 is driven in the X direction using an amplifier 108. The Z-direction driving coils 104, the number of which is P=2, are connected in series and are driven in the Z direction using an amplifier 107a.

Owing to such a configuration, two-degree-of-freedom motion: thrusting motion in the X direction and levitating motion in the Z direction can be performed. In addition, a multi-degree-of-freedom actuator that performs levitating motion in the Z direction and thrusting motion in the X direction can be provided, and an actuator in which the magnetic gap can be reduced and that is compact yet has large thrust force, levitation force, and variable levitation force can be provided.

Second Embodiment

Next, a second embodiment of the present invention will be described.

Figure 6:
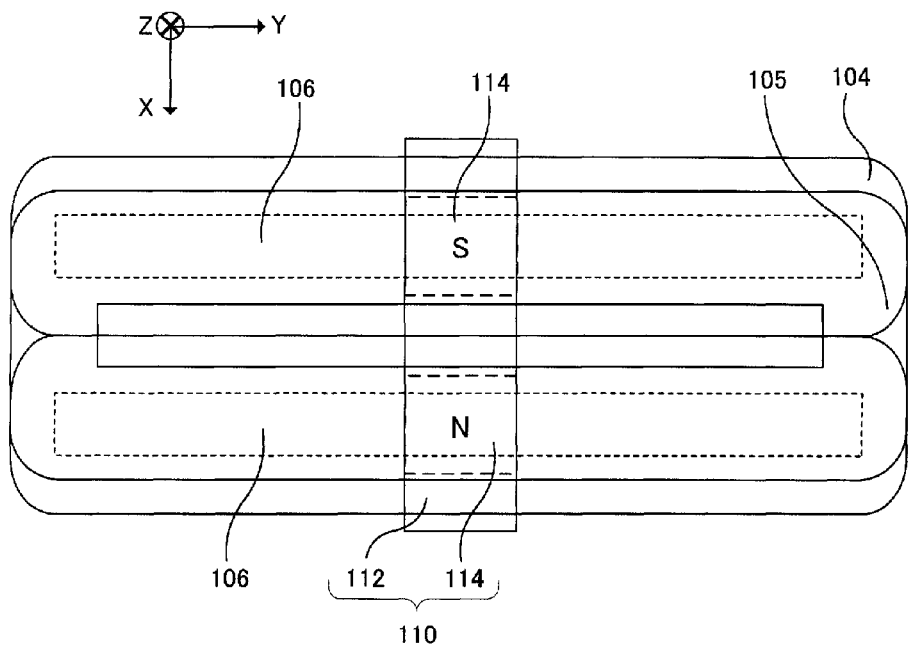
FIG. 6 is a bottom view of a multi-degree-of-freedom actuator showing a second embodiment.
Figure 7:
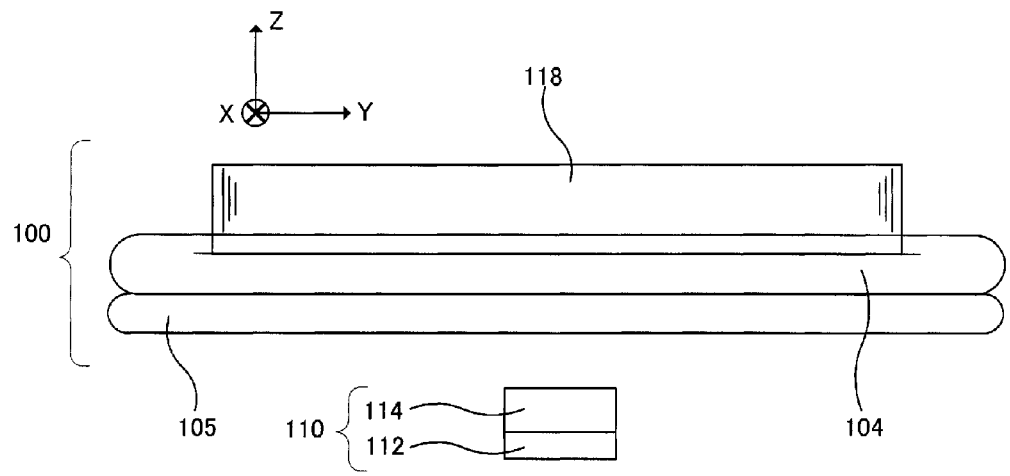
FIG. 7 is a side view of the multi-degree-of-freedom actuator showing the second embodiment.
Figure 8:
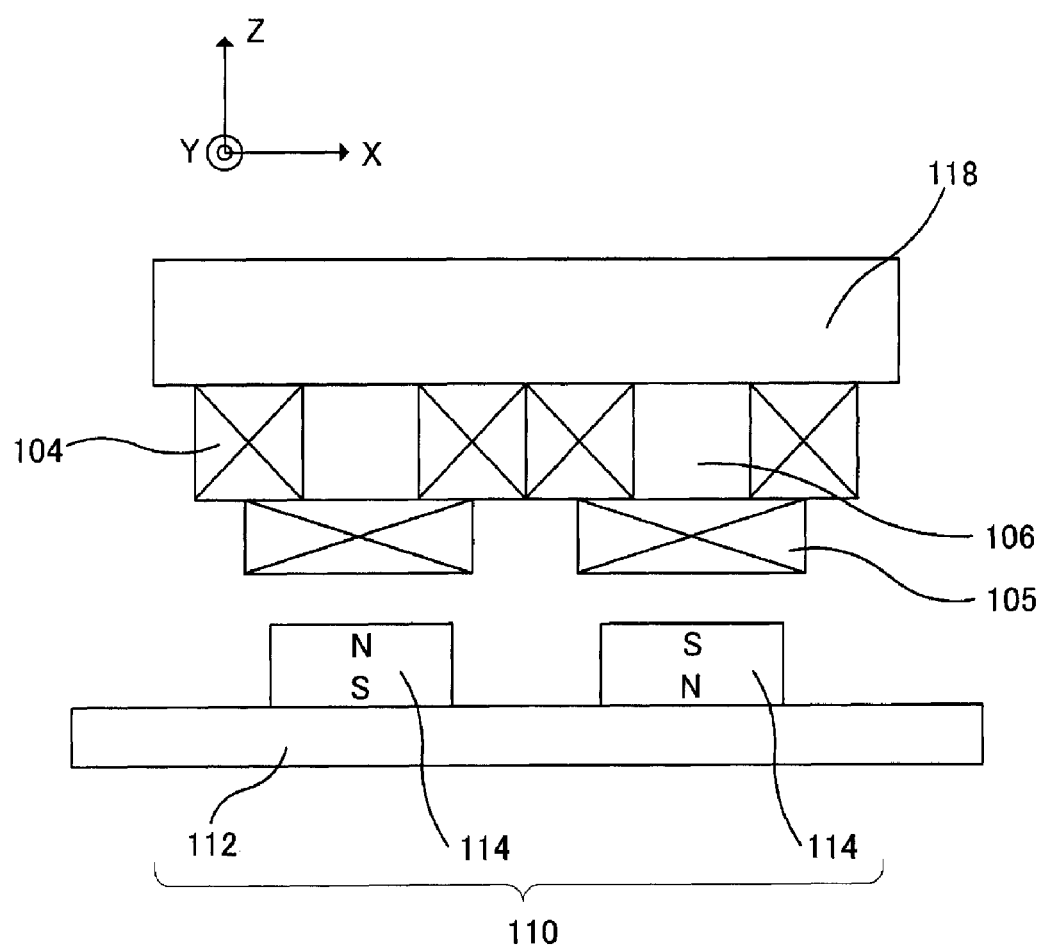
FIG. 8 is a front sectional view of the multi-degree-of-freedom actuator showing the second embodiment.

A multi-degree-of-freedom actuator showing a second embodiment of the present invention will be described with reference to the bottom view of FIG. 6, the side view of FIG. 7, and the sectional view of FIG. 8.

Teeth 106 are integrally formed in a stator core 118, the teeth 106 are inserted into Z-direction driving coils 104, and an X-direction driving coil 105 is disposed at the lower ends of the teeth 106. In a conventional configuration, a stator core is disposed on the top of a stack of coils, and therefore there is a large magnetic gap equal to the total thickness of all the coils. In contrast, when teeth are disposed in the air cores of the Z-direction driving coils 104, the magnetic gap is equal only to the thickness of the X-direction driving coil 105. Therefore, without increasing the magnetic gap, the Z-direction driving coils can be thickened to increase the number of turns of wire, and the X-direction driving coil can be widened to increase the number of turns of wire. Therefore, a multi-degree-of-freedom actuator having large thrust force in the X direction and large levitation force and variable levitation force in the Z direction can be provided.

Third Embodiment

Next, a third embodiment of the present invention will be described.

Figure 9:
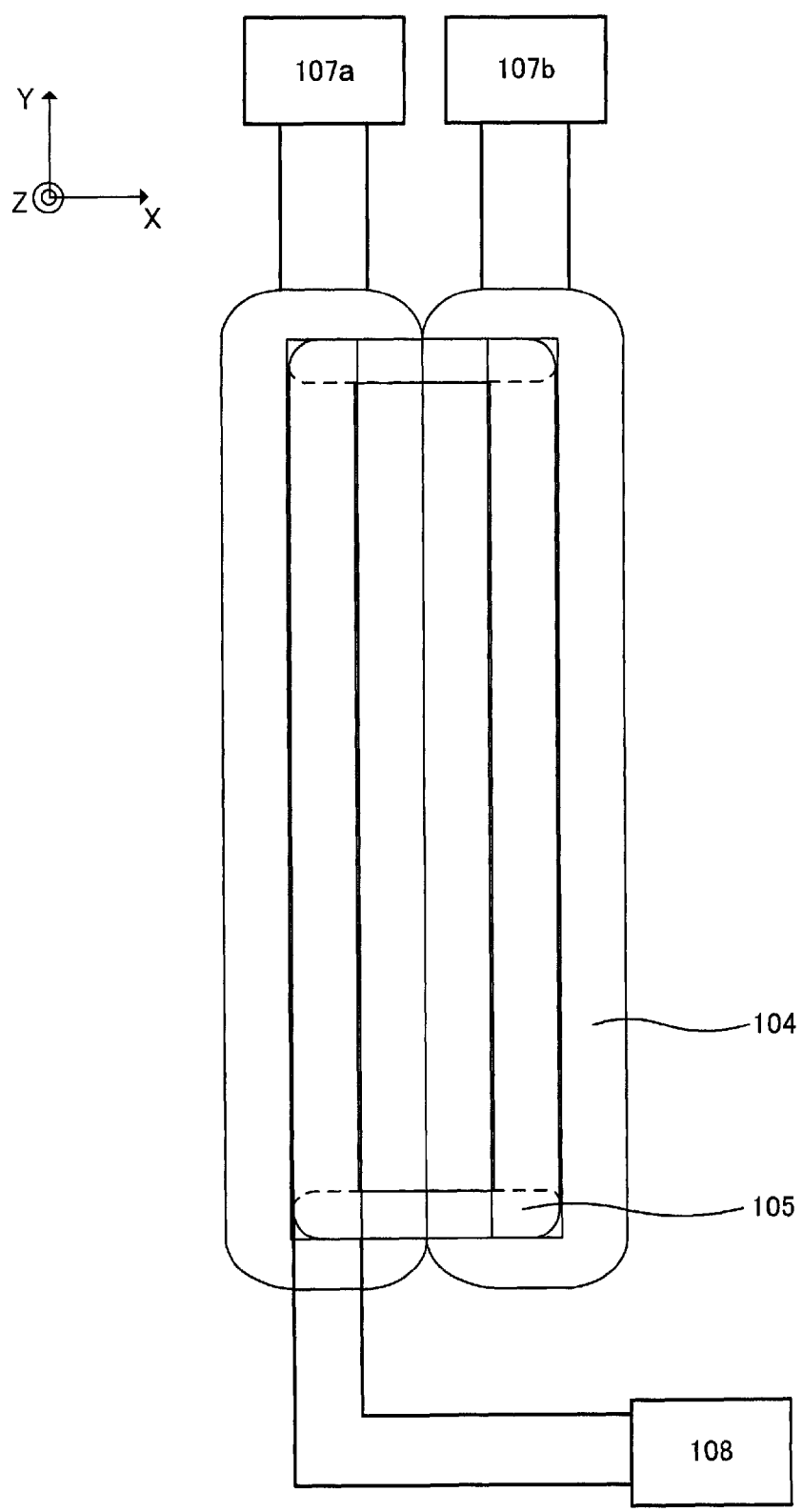
FIG. 9 shows the principle of generation of $\theta_Y$ motion showing a third embodiment.

The connection between a multi-degree-of-freedom actuator and amplifiers showing a third embodiment of the present invention will be described with reference to the connection configuration diagram of FIG. 9.

Z-direction driving coils 104, the number of which is P=2, are driven using two amplifiers 107a and 107b in the Z direction and the $\theta_Y$ direction (the direction of rotation about the Y axis perpendicular to the X axis and the Z axis), and an X-direction driving coil 105 is connected to an amplifier 108 and is driven using the amplifier 108 in the X direction.

Figure 10:
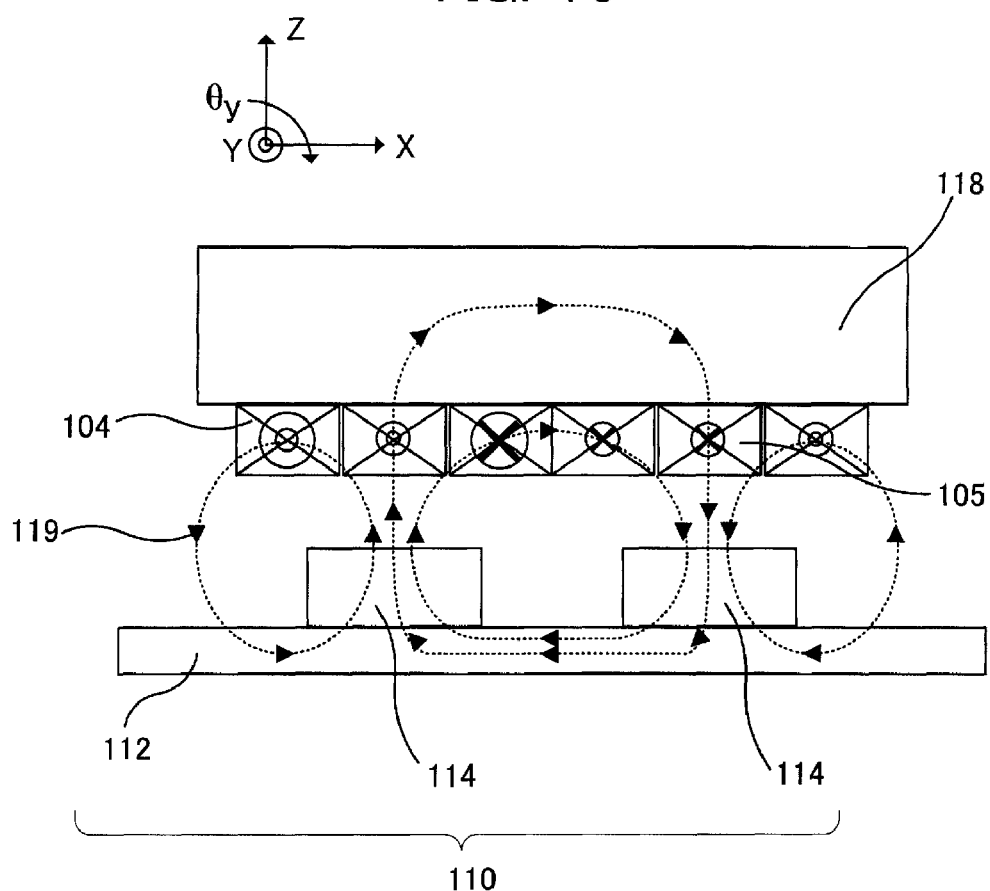
FIG. 10 shows the principle of generation of variable levitation force and thrust force in the third embodiment.

The principle of generation of $\theta_Y$ motion is shown in FIG. 10. Dotted lines show magnetic flux lines 119 due to the permanent magnets 114.

As shown by the magnetic flux lines 119 due to the permanent magnets 114, the magnetic flux in the ±Z direction passes through the X-direction driving coil 105, and the magnetic flux in the ±X direction passes through the Z-direction driving coils 104.

When electrical current is applied in the direction shown in FIG. 10, Lorentz force in the -Z direction is generated in the Z-direction driving coils 104, and as a result, variable levitation force is generated in the movable element 110 in the Z direction.

In addition, Lorentz force in the −X direction is generated in the X-direction driving coil 105, and as a result, thrust force is generated in the movable element 110 in the +X direction.

As shown in FIG. 10, the current of the Z-direction driving coil 104 (on the left side of FIG. 10) connected to the Z-direction driving amplifier 107a is larger than the current of the Z-direction driving coil 104 (on the right side of FIG. 10) connected to the Z-direction driving amplifier 107b, and therefore the variable levitation force acting on the left Z-direction driving coil 104 is larger than the variable levitation force acting on the right Z-direction driving coil 104. Thus, driving in the $\theta_Y$ direction shown in the figure can also be performed.

Owing to the above configuration, a multi-degree-of-freedom actuator that performs three-degree-of-freedom motion: driving motion in the $\theta_Y$ direction in addition to levitating motion in the Z direction and thrusting motion in the X direction can be provided.

Although P=2 in this embodiment, it goes without saying that when a plurality of the configurations of this embodiment are arranged in the X direction (P=4, 6, . . . ), the advantageous effects of the present invention can be obtained.

Next, a precision stage including these multi-degree-of-freedom actuators will be described.

Fourth Embodiment

Figure 11:
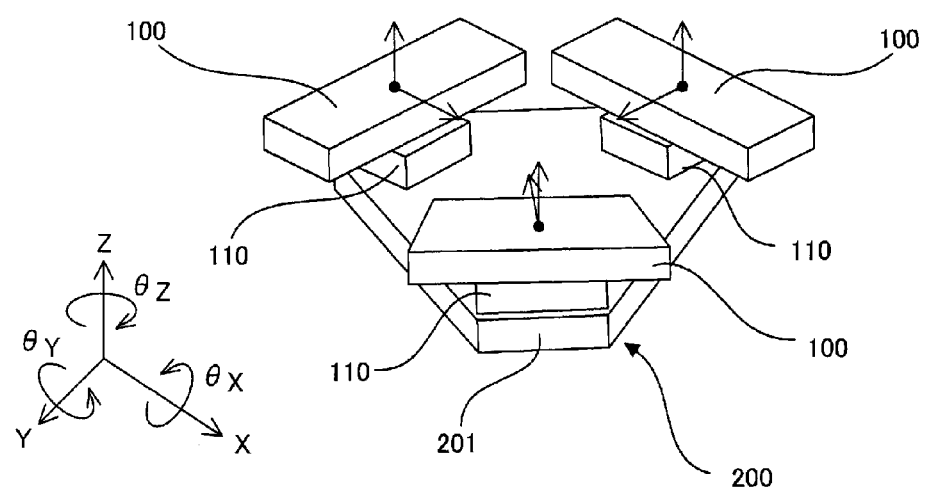
FIG. 11 is a perspective view of a stage device showing a fourth embodiment.

FIG. 11 is a perspective view of a stage device showing a fourth embodiment of the present invention.

A fourth embodiment of the present invention is a stage device including three multi-degree-of-freedom actuators according to the first embodiment or the second embodiment. A levitating element 200 includes a table 201 and three movable elements 110. The movable elements 110 are placed on the horizontal XY plane of the table 201 and differ in angle from each other by 120 degrees. Three stators 100 are placed over the movable elements 110 with a gap. The three stators 100 are placed on a top plate (not shown) for fixation. The directions of the thrust force and levitation force generated in each movable element 110 are as shown by arrows on the top of each stator 100 in FIG. 11. All the three movable elements 110 generate levitation force in the Z direction. In addition, when the X direction in the horizontal XY plane is zero degrees, the movable elements 110 generate thrust force in the directions of zero degrees, 120 degrees, and 240 degrees.

The position of the levitating element 200 in three linear directions of X, Y, and Z and three rotational directions of $\theta_X$, $\theta_Y$, and $\theta_Z$ about each axis can be detected with a high degree of accuracy with an optical distance detector such as a laser interferometer (not shown).

Since each multi-degree-of-freedom actuator can generate force in two directions: thrust force and levitation force, the stage device having the above configuration can control a total of six forces with the three multi-degree-of-freedom actuators. By performing control with the sizes of the six forces, the points where the forces are generated, and the position of the center of gravity of the levitating element taken into account, the levitating element 200 can be moved in the three linear directions of X, Y, and Z and the three rotational directions of $\theta_X$, $\theta_Y$, and $\theta_Z$.

Therefore, compared to a conventional stage device, the number of movable elements attached to the levitating element can be reduced, and the weight of the levitating element can be reduced. In addition, the levitating element can be stably levitated and rapidly positioned.

Fifth Embodiment

Figure 12:
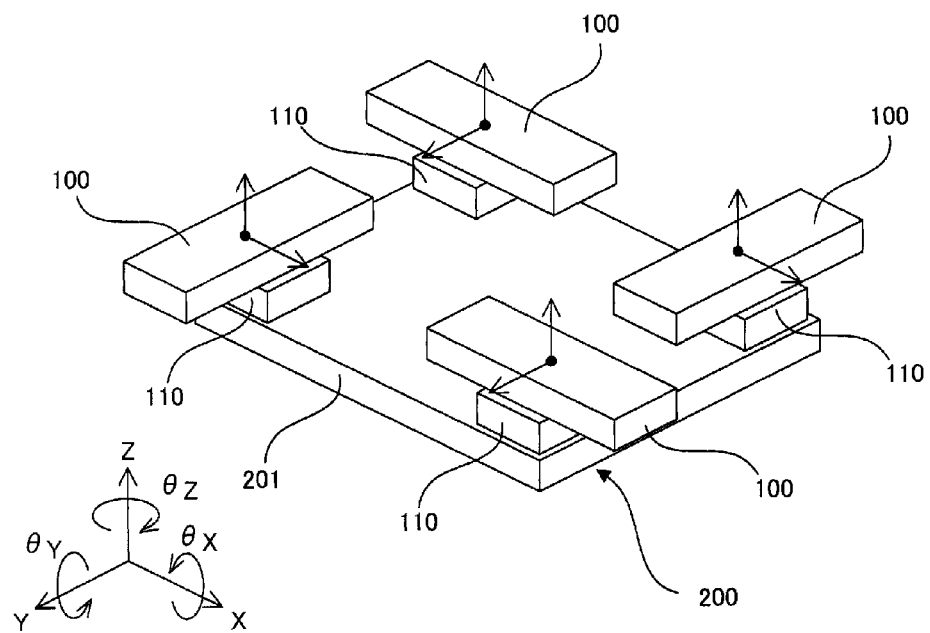
FIG. 12 is a perspective view of a stage device showing a fifth embodiment.

FIG. 12 is a perspective view of a stage device showing a fifth embodiment of the present invention.

A levitating element 200 includes a substantially quadrilateral table 201 having a large area, and movable elements 110 placed at the four corners of the table 201. Of the four movable elements 110, two are disposed along the horizontal X direction at diagonal positions of the table 201, and the other two are disposed along the horizontal Y direction at diagonal positions of the table 201. Four stators 100 are placed over the movable elements 110 with a gap. The four stators 100 are placed on a top plate (not shown) for fixation. The directions of the thrust force and levitation force generated in each movable element 110 are as shown by arrows on the top of each stator 100 in FIG. 12. All the four movable elements 110 generate levitation force in the Z direction. In addition, in the XY plane, each movable element 110 generates thrust force in the X direction and the Y direction.

The position of the levitating element 200 in three linear directions of X, Y, and Z and three rotational directions of $\theta_X$, $\theta_Y$, and $\theta_Z$ about each axis can be detected with a high degree of accuracy with a laser interferometer or the like (not shown).

Since each multi-degree-of-freedom actuator can generate force in two directions: thrust force and levitation force, the stage device having the above configuration can control a total of eight forces with the four multi-degree-of-freedom actuators. By performing control with the sizes of the eight forces, the points where the forces are generated, and the position of the center of gravity of the levitating element taken into account, the levitating element 200 can be moved in the three linear directions of X, Y, and Z and the three rotational directions of $\theta_X$, $\theta_Y$, and $\theta_Z$.

Therefore, compared to a conventional stage device, the number of movable elements attached to the levitating element can be reduced, and the weight of the levitating element can be reduced. In addition, the levitating element can be stably levitated and rapidly positioned. Furthermore, since four multi-degree-of-freedom actuators are disposed at the four corners of the table, even a levitating element having a large table area can be stably levitated.

Sixth Embodiment

Figure 13:
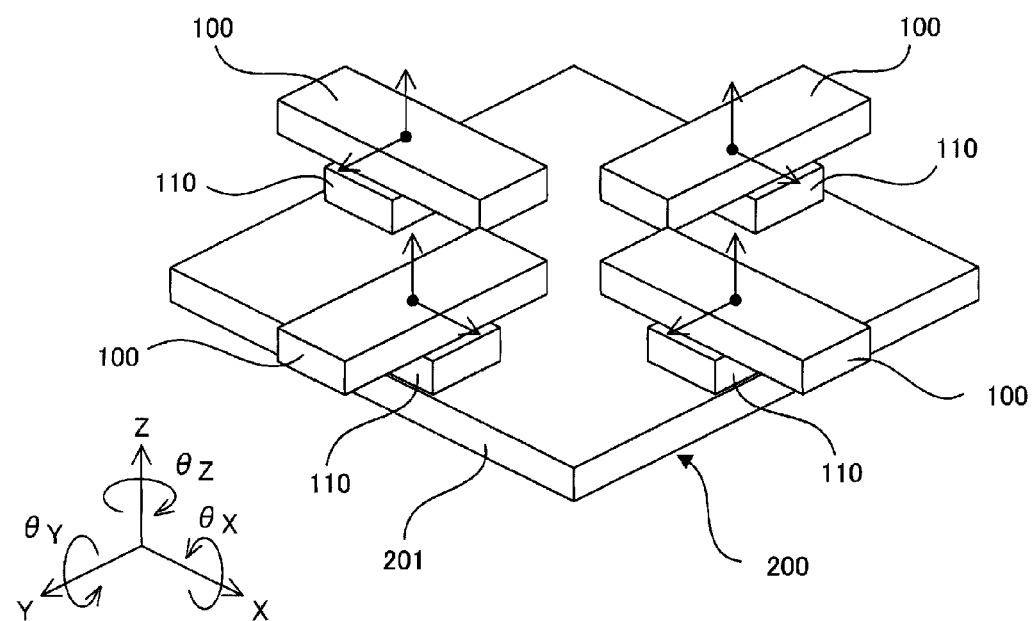
FIG. 13 is a perspective view of a stage device showing a sixth embodiment.

FIG. 13 is a perspective view of a stage device showing a sixth embodiment of the present invention.

In the fifth embodiment, of the four movable elements 110, two are disposed along the horizontal X direction at diagonal positions of the table 201, and the other two are disposed along the horizontal Y direction at diagonal positions of the table 201. In contrast, in a sixth embodiment, of the four movable elements 110, two are disposed along the horizontal X direction on the left and right sides of the table 201, and the other two are disposed along the horizontal Y direction on the upper and lower sides of the table 201.

In the case of the above configuration, the levitating element can be controlled as in the fifth embodiment, and the same advantageous effects can be obtained.

Seventh Embodiment

Figure 14:
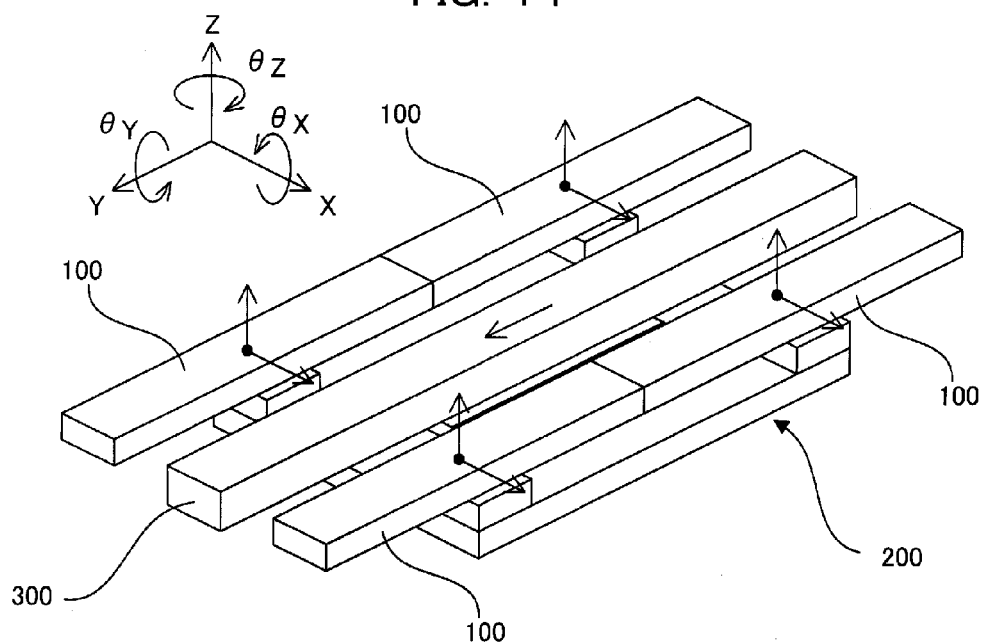
FIG. 14 is a perspective view of a stage device showing a seventh embodiment.
Figure 15:
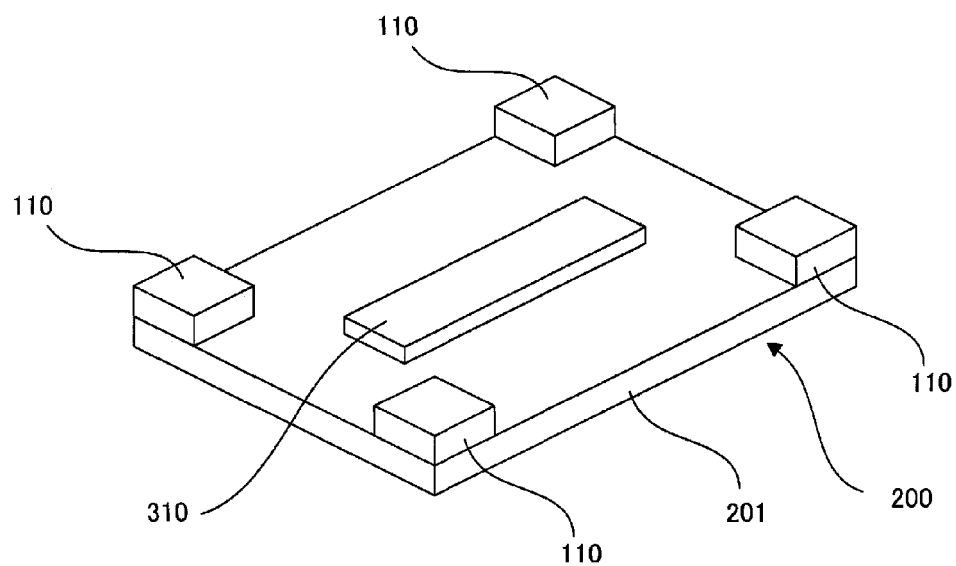
FIG. 15 is a perspective view of a levitating element of the stage device showing the seventh embodiment.

FIGS. 14 and 15 are perspective views of a stage device and its levitating element showing a seventh embodiment of the present invention. In these figures, reference numeral 300 denotes a linear motor stator 300, and reference numeral 310 denotes a linear motor movable element.

A levitating element 200 includes a substantially quadrilateral table 201 and four movable elements 110. Of the four movable elements, two are arranged in series along the horizontal Y direction, and the other two are also arranged in series along the horizontal Y direction. The two sets of two are arranged in parallel along the X direction. Four stators 100 are placed over the movable elements 110 with a gap. The four stators 100 are placed on a top plate (not shown) for fixation. The directions of the thrust force and levitation force generated in each movable element 110 are as shown by arrows on the top of each stator 100 in FIG. 14. All the four movable elements 110 generate levitation force in the Z direction and thrust force in the X direction. The stators 100 are elongated in the Y direction so that thrust force and levitation force can be generated even when the levitating element 200 is significantly moved in the Y direction.

In addition, a linear motor movable element 310 is disposed in the center of the table 201. A linear motor stator 300 is placed over the linear motor movable element 310 with a gap. The linear motor stator 300 is placed on a top plate (not shown) for fixation. The direction of the thrust force generated in the linear motor movable element 310 is the Y direction as shown by an arrow on the top of the linear motor stator 300 in FIG. 14.

The position of the levitating element 200 in three linear directions of X, Y, and Z and three rotational directions of $\theta_X$, $\theta_Y$, and $\theta_Z$ about each axis can be detected with a high degree of accuracy with a laser interferometer or the like (not shown).

Since each multi-degree-of-freedom actuator can generate force in two directions: thrust force and levitation force, the stage device having the above configuration can control a total of eight forces with the four multi-degree-of-freedom actuators. However, the thrust forces of the four multi-degree-of-freedom actuators are all in the X direction, and therefore the force that moves the levitating element in the Y direction cannot be obtained. That is to say, by performing control with the sizes of the eight forces, the points where the forces are generated, and the position of the center of gravity of the levitating element taken into account, the levitating element 200 can be moved in the two linear directions of X and Z and the three rotational directions of $\theta_X$, $\theta_Y$, and $\theta_Z$. In addition, since the force in the Y direction can be controlled with a linear motor, the levitating element can be significantly moved in the Y direction.

Therefore, compared to a conventional stage device, the number of movable elements attached to the levitating element can be reduced, and stable levitation and significant movement in one direction can be performed.

An actuator that can perform levitating motion in the Z direction and thrusting motion in the X direction and that is compact yet has large thrust force, levitation force, and variable levitation force can be provided. Therefore, the present invention can also be applied to a vacuum conveying apparatus.

What is claimed is:

1. A multi-degree-of-freedom actuator comprising:
a movable element having a first permanent magnet and a second permanent magnet arranged in an X-direction; and
a stator including a stator core and a plurality of coils, the plurality of coils comprising:
an X-direction driving coil to relatively drive the movable element in the X-direction and having a first coil side and a second coil side opposite to the first coil side; and
a first Z-direction driving coil and a second Z-direction driving coil to relatively drive the movable element in a Z-direction, each of the first and second Z-direction driving coils having an air core around which a wire is wound and provided such that the air core faces a magnet pole of each of the first and second permanent magnets, the first coil side being provided at the air core of the first Z-direction driving coil, the second coil side being provided at the air core of the second Z-direction driving coil.

2. The multi-degree-of-freedom actuator according to claim 1, wherein the first coil side is inserted in the air core of the first Z-direction driving coil and the second coil side is inserted in the air core of the second Z-direction driving coil.

3. The multi-degree-of-freedom actuator according to claim 1, further comprising:
teeth integrally formed in the stator core, wherein the teeth are inserted into the air cores of the first and second Z-direction driving coils, and wherein the first and second coil sides are disposed at ends of the teeth.

4. The multi-degree-of-freedom actuator according to claim 1, further comprising:
an X-direction amplifier connected to the X-direction driving coil to drive the X-direction driving coil; and
a Z-direction amplifier connected to the first and second Z-direction driving coils to drive the first and second Z-direction driving coils, wherein the X-direction amplifier and the Z-direction amplifier operate independently of one another.

5. The multi-degree-of-freedom actuator according to claim 1, further comprising:
an X-direction amplifier connected to the X-direction driving coil to drive the X-direction driving coil;
a first Z-direction amplifier connected to the first Z-direction driving coil to drive the first Z-direction driving coil; and
a second Z-direction amplifier connected to the second Z-direction driving coil to drive the second Z-direction driving coil, wherein the X-direction amplifier, the first Z-direction amplifier and the second Z-direction amplifier operate independently of one another.

6. A stage device comprising:
at least three multi-degree-of-freedom actuators each comprising:
a movable element having a first permanent magnet and a second permanent magnet arranged in an X-direction; and
a stator including a stator core and a plurality of coils, the plurality of coils comprising:
an X-direction driving coil to relatively drive the movable element in the X-direction and having a first coil side and a second coil side opposite to the first coil side; and
a first Z-direction driving coil and a second Z-direction driving coil to relatively drive the movable element in a Z-direction, each of the first and second Z-direction driving coils having an air core around which a wire is wound and provided such that the air core faces a magnet pole of each of the first and second permanent magnets, the first coil side being provided at the air core of the first Z-direction driving coil, the second coil side being provided at the air core of the second Z-direction driving coil; and
a levitating element moved with multiple degrees of freedom by the at least three multi-degree-of-freedom actuators.

7. The stage device according to claim 6, wherein a number of the at least three multi-degree-of-freedom actuators is three, and wherein the at least three multi-degree-of-freedom actuators are placed horizontally in an XY plane and differ in angle from each other by 120 degrees.

8. The stage device according to claim 6, wherein a number of the at least three multi-degree-of-freedom actuators is four, and wherein two of the at least three multi-degree-of-freedom actuators are arranged horizontally along the X direction, and other two of the at least three multi-degree-of-freedom actuators are arranged horizontally along a Y direction.

9. The stage device according to claim 6, further comprising a linear motor capable of moving significantly in one direction.

* * * * *